(12) United States Patent
Wu et al.

(10) Patent No.: US 8,675,435 B2
(45) Date of Patent: Mar. 18, 2014

(54) ASYMMETRIC SENSE AMPLIFIER DESIGN

(71) Applicant: Taiwan Semiconductor Manufacturing Company, Ltd., Hsin-Chu (TW)

(72) Inventors: Ching-Wei Wu, Caotun Town (TW); Kuang Ting Chen, Taipei (TW); Cheng-Hung Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/886,120

(22) Filed: May 2, 2013

(65) Prior Publication Data

US 2013/0235687 A1  Sep. 12, 2013

Related U.S. Application Data

(62) Division of application No. 13/030,722, filed on Feb. 18, 2011, now Pat. No. 8,437,210.

(51) Int. Cl.
*G11C 7/00* (2006.01)

(52) U.S. Cl.
USPC .......................................................... 365/205

(58) Field of Classification Search
USPC .......................................................... 365/205
See application file for complete search history.

(56) References Cited

U.S. PATENT DOCUMENTS

| 5,949,256 | A | 9/1999 | Zhang et al. | |
| 7,542,362 | B2 | 6/2009 | Versen et al. | |
| 2007/0163815 | A1* | 7/2007 | Ungaretti et al. | 178/18.06 |
| 2009/0296506 | A1* | 12/2009 | Chen et al. | 365/205 |
| 2010/0309741 | A1* | 12/2010 | Mizuno et al. | 365/203 |
| 2011/0062506 | A1* | 3/2011 | Xue et al. | 257/306 |

FOREIGN PATENT DOCUMENTS

CN   101770802   7/2010

OTHER PUBLICATIONS

Barry, R.L., et al., "A High-Performance ROM Compiler for 0.501. µm and 0.36µm CMOS Technologies," IEEE, 1995, pp. 370-373.
Weste, N., et al., "CMOS VLSI Design," Third Edition, A Circuits and Systems Perspective, 11.4 Read-only Memory, p. 739.

* cited by examiner

*Primary Examiner* — Hoai V Ho
*Assistant Examiner* — Min Huang
(74) *Attorney, Agent, or Firm* — Slater & Matsil, L.L.P.

(57) ABSTRACT

A circuit includes a first inverter including a first PMOS transistor and a first NMOS transistor, and a second inverter including a second PMOS transistor and a second NMOS transistor. A first node is connected to gates of the first PMOS transistor and the first NMOS transistor and drains of the second PMOS transistor and the second NMOS transistor. A second node is connected to gates of the second PMOS transistor and the second NMOS transistor and drains of the first PMOS transistor and the first NMOS transistor. The circuit further includes a first capacitor having a first capacitance connected to the first node; and a second capacitor having a second capacitance connected to the second node. The second capacitance is greater than the first capacitance.

17 Claims, 4 Drawing Sheets

ASYMMETRIC SENSE AMPLIFIER DESIGN

BACKGROUND

Sense amplifiers are used for reading stored data from memory arrays. The stored data in a memory array may be provided to a data line, which is connected to a sense amplifier. The sense amplifier then amplifies the data.

Sense amplifiers include single-ended amplifiers and differential sense amplifiers. In the single-ended sense amplifiers, the data retrieved from the memory array are amplified directly, for example, through an inverter. The single-ended sense amplifiers require the signals read from the memory array to have high swings, and are not reliable for small-signal sensing. Furthermore, the access time of the single-ended sense amplifiers is long, and the read margins of the single-ended sense amplifiers are low. Therefore, although the single-ended sense amplifiers typically have simple designs that require small chip areas, the performance of the single-ended sense amplifiers is not satisfactory.

In a differential sense amplifier, a reference voltage generator may be needed to generate a reference voltage. A reference memory column may also be needed to provide a signal to the reference voltage generator. The data read from the memory array may be provided to the differential sense amplifier, which receive the data and the reference voltage as differential input signals. The state of the differential sense amplifier is determined by the voltage levels of the reference voltage and the data.

In general, with the design of the reference memory columns, differential sense amplifiers may reliably sense and amplify the data. However, the reference memory column and the reference voltage generator require complex circuit designs to ensure that the reference voltage is stable. Accordingly, a significant chip area penalty is involved.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

An asymmetric sense amplifier and the method of forming the same are provided in accordance with an embodiment. The variations and the operation of the embodiment are then discussed. Throughout the various views and illustrative embodiments, like reference numbers are used to designate like elements.

Figure 1:
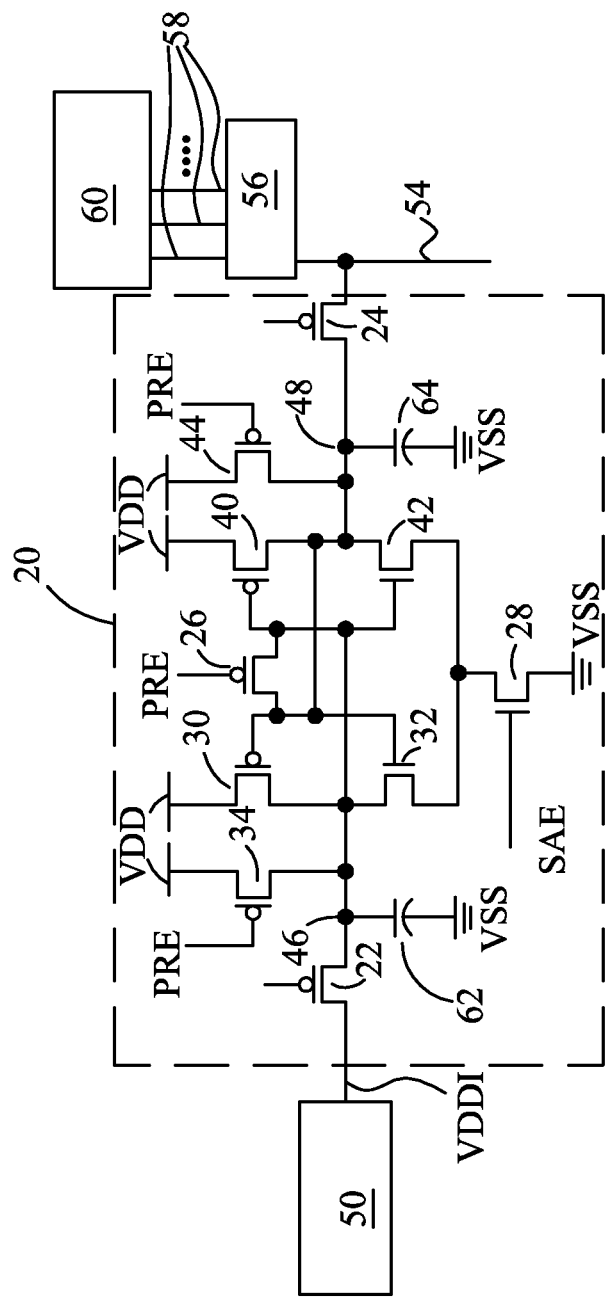
FIG. 1 illustrates a circuit diagram of an asymmetric sense amplifier in accordance with an embodiment, wherein a fixed logic high voltage is used as one of the inputs of the asymmetric sense amplifier.

FIG. 1 illustrates a circuit diagram of asymmetric sense amplifier 20 in accordance with an embodiment. Asymmetric sense amplifier 20 includes data-in transistors 22 and 24, pull-up transistors (PMOS transistors) 30 and 40, and pull-down transistors (NMOS transistors) 32 and 42. The gates of transistors 22 and 24 are controlled to allow sense amplifier 20 to receive signals into asymmetric sense amplifier 20. A latch is formed of pull-up transistors 30 and 40 and pull-down transistors 32 and 42, wherein transistors 30 and 32 form a first inverter, and transistors 40 and 42 form a second inverter. The sources of PMOS transistors 30 and 40 are coupled to positive power supply node VDD, which carries the positive power supply voltage (also referred to as power supply voltage VDD). The gates of transistors 30 and 32 are connected to the drains of transistors 40 and 42, and the gates of transistors 40 and 42 are connected to the drains of transistors 30 and 32.

Transistor 28 has its drain coupled to the sources of transistors 32 and 42, and its source coupled to power supply node VSS, which carries a low power supply voltage (also referred to as power supply voltage VSS), which may be the electrical ground. The gate of NMOS transistor 28 is connected to a sense amplifier enable (SAE) node, through which an SAE signal may be provided to enable asymmetric sense amplifier 20 to settle on one of the bi-stable states. Pre-charge transistors 26, 34, and 44, which may be PMOS transistors, are used to pre-charge asymmetric sense amplifier 20, during which pre-charge transistors 26, 34, and 44 are turned on by pre-charge signal PRE. PMOS transistors 34 and 44 have their sources coupled to power supply voltage VDD, and their drains coupled to nodes 46 and 48 respectively. PMOS transistor 26 has a first source/drain coupled to node 46, and a second source/drain coupled to node 48. Nodes 46 and 48 are complementary nodes since when asymmetric sense amplifier 20 is at one of the bi-stable states, the voltages on nodes 46 and 48 are complementary, with one being a logic high voltage, which may be close to voltage VDD, and the other one being a logic low voltage, which may be close to voltage VSS.

Data-in transistor 22 has one of its source/drains coupled to fixed voltage VDDI, which may be equal to or substantially equal to power supply voltage VDD. For example, fixed voltage VDDI may be between about 80 percent and about 100 percent VDD, or between about 90 percent and about 100 percent VDD. The other source/drain of data-in transistor 22 is coupled to node 46. Voltage VDDI may be supplied by voltage source 50. Data-in transistor 24 has one of its source/drains coupled to data line 54, and the other source/drain coupled to node 48. The gates of transistors 22 and 24 may be interconnected so that they are turned on and off simultaneously. Data line 54 may be connected to an output of multiplexer 56, whose inputs are connected to bit lines 58 of memory array 60. Through multiplexer 56, the signals/voltages on bit lines 58 may be multiplexed to data line 54.

Capacitor 62 is coupled between node 46 and power supply node VSS. Capacitor 64 is coupled between node 48 and power supply node VSS. Capacitors 62 and 64 are asymmetric, with the capacitance C64 of capacitor 64 being greater than the capacitance C62 of capacitor 62. Accordingly, sense amplifier 20 is referred to as being an asymmetric sense amplifier throughout the description. Ratio C64/C62 may be greater than about 1.2, greater than about 1.5, or greater than about 2.0. In alternative embodiments, capacitor 62 is not formed, which is equivalent to connect capacitor 62 that has zero capacitance (farad).

The operation of asymmetric sense amplifier 20 is discussed as follows. Before the read operation of memory array 60, PMOS transistors 22, 24, and 28 are turned off. Pre-charge transistors 26, 34, and 44 are turned on, and hence nodes 46 and 48 are pre-charged to power supply voltage VDD. Pre-charge transistors 26, 34, and 44 are then turned off. In a read operation of memory array 60, data line 54 receives data from one of bit lines 58 through multiplexer 56. Data-in transistors 22 and 24 are turned on, so that voltage VDDI is received into asymmetric sense amplifier 20 and provided to node 46, and the voltage on data line 54 is received into asymmetric sense amplifier 20 and provided to node 48. Transistor 28 is turned on to discharge nodes 46 and 48. Depending on the discharging states, one of the bi-stable states will be reached. During the bi-stable states, one of nodes 46 and 48 has a logic high voltage (such as close to positive power supply voltage VDD), while the other has a logic low voltage (such as close to power supply voltage VSS).

If the signal on data line 54 is a logic low signal, for example, close to power supply voltage VSS, there is a significant difference between the voltage on node 46 (which may be voltage VDD) and the voltage on node 48, which may be 0V. Accordingly, through the discharging of transistor 28, a first stable state may be reached with no error, wherein the voltage on node 46 remains at the logic high voltage, and the voltage on node 48 remains at the logic low voltage.

If the signal on data line 54 is a logic high signal, for example, equal to VDD, the voltages on nodes 46 and 48 may be initially the same, or at least close to each other. Since capacitance C64 is greater than capacitance C62, the discharging (and hence the voltage dropping) of node 48 is slower than the discharging of node 46. Accordingly, through the discharging of nodes 46 and 48 using transistor 28, a second stable state may be reached with no error, wherein the voltage on node 46 is a logic low voltage, and the voltage on node 48 is a logic high voltage. Accordingly, with the asymmetric design, the likelihood of the competition between the discharging of nodes 46 and 48, which may cause a wrong stable state to be set when data line 54 is at a logic high voltage, is eliminated.

Figure 2:
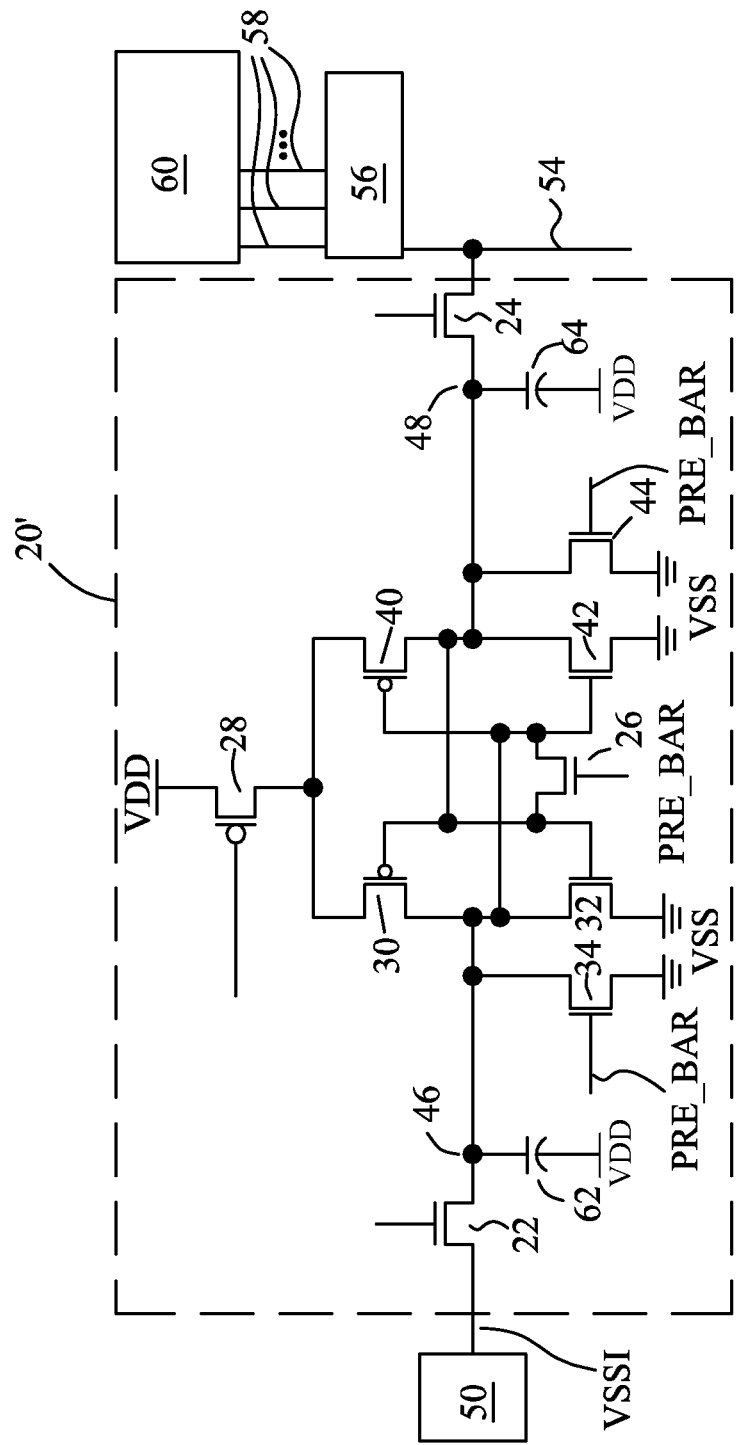
FIG. 2 illustrates a circuit diagram of an asymmetric sense amplifier in accordance with an alternative embodiment, wherein a fixed logic low voltage is used as one of the inputs of the asymmetric sense amplifier.

FIG. 2 illustrates asymmetric sense amplifier 20' in accordance with alternative embodiments. Unless specified otherwise, the reference numerals in these embodiments represent like elements as in the embodiments illustrated in FIG. 1. These embodiments are similar to the embodiments as shown in FIG. 1, wherein transistors 22, 24, 26, 34, and 44 are NMOS transistors, while transistor 28 is a PMOS transistor. Capacitors 62 and 64 are asymmetric transistors, wherein capacitance C64 of capacitor 64 is greater than capacitance C62 of capacitor 62. Asymmetric sense amplifier 20' may be pre-charged to a logic low voltage through transistors 26, 34, and 44. The pre-charging may be activated by applying pre-charge signal PRE_BAR, which is inversed from pre-charge signal PRE as shown in FIG. 1.

Fixed voltage VSSI, which may be equal to VSS or substantially equal to VSS, is connected to transistor 22. Voltage VSSI may be generated by voltage source 50. Accordingly, if the datum on data line 54 is a logic high voltage, for example, equal to VDD, there is a significant difference between the voltage on node 46, which may be close to VSS, and the voltage on node 48, which may be close to VDD. Accordingly, through the charging of transistor 28, a first stable state may be reached with no error, wherein the voltage on node 46 remains to be a logic low voltage, and the voltage on node 48 remains to be a logic high voltage.

If the signal on data line 54 is a logic low signal, for example, equal to or close to voltage VSS (0V), the voltages on nodes 46 and 48 may be initially the same or close to each other. Since capacitance C64 is greater than capacitance C62, the charging of node 48 is slower than the charging of node 46. Accordingly, through the charging of transistor 28, a second stable state may be reached with no error, with the voltage on node 46 being a logic high voltage, and the voltage on node 48 being a logic low voltage. Accordingly, with the asymmetric design of asymmetric sense amplifier 20, the likelihood of the competition between the charging of nodes 46 and 48, which may cause a wrong stable state to be set when data line 54 is at a logic low voltage, is eliminated.

Figure 3:
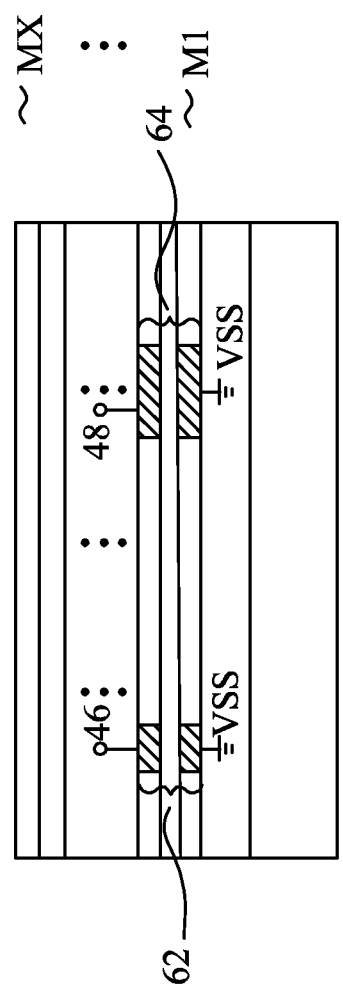
FIGS. 3 and 4 are cross-sectional views of the implementations of the capacitors in the asymmetric sense amplifiers.

The implementation of capacitors 62 and 64 may be through various schemes. For example, FIG. 3 illustrates an exemplary scheme, in which capacitors 62 and 64 are formed through metal lines and/or pads (which form capacitor plates) in metal layers. The capacitor plates of capacitors 62 and 64 may extend into one or a plurality of metal layers M1 through Mx in any combination, with x being an integer that represents the number of the top metal layer. The capacitors may be metal-insulator-metal (MIM) capacitors, with each of the MIM capacitors including two capacitor plates parallel to each other. Alternatively, capacitors 62 and 64 may be metal-oxide-metal (MOM) capacitors, with each of capacitors 62 and 64 including a first capacitor electrode and a second capacitor electrode. Each of the first and second capacitor electrodes may comprise a plurality of fingers (not shown), with the fingers of the first and the second capacitor electrodes being disposed in an alternating pattern.

Figure 4:
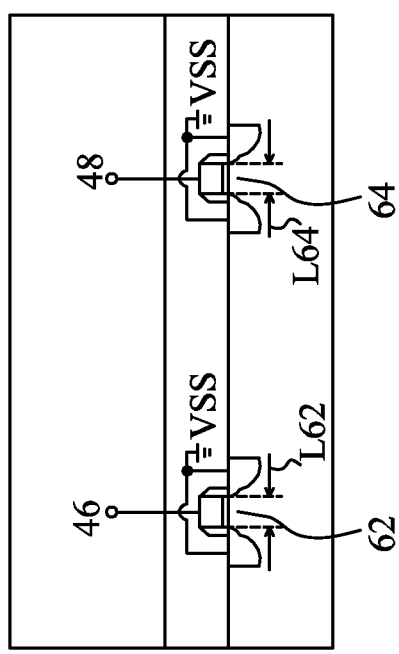

Alternatively, as shown in FIG. 4, capacitors 62 and 64 may be MOS capacitors formed of MOS transistors, with the source and drain regions of each of the MOS transistors interconnected. The MOS capacitors may be PMOS or NMOS capacitors. In this embodiment, the value (W64×L64) of capacitor 64 is greater than (W62×L62) of capacitor 62, wherein W64 and W62 (not shown) are the gate widths of MOS capacitors 64 and 62, respectively, and L64 and L62 are the gate lengths of MOS capacitors 64 and 62, respectively. Furthermore, (W64×L64)/(W62×L62) is greater than 1, and may be greater than 1.2, greater than 1.5, or greater than 2.0.

In yet other embodiments, capacitors 62 and 64 may be formed in the form of well-capacitors, which may be the junction capacitors formed between well regions and the respective substrate that has an opposite conductivity type than the well regions. In yet other embodiments, capacitors 62 and 64 may be contact-to-poly capacitors, which include polysilicon lines (not shown) acting as one capacitor plate, and contact plugs (not shown) acting as the other capacitor plate.

In the embodiments, with the using of the asymmetric sense amplifier, a reliable sensing may be achieved. The improvement in the performance may not need extra chip areas. Compared to conventional sense amplifiers that require additional reference memory column(s) and reference voltage generator(s), the chip area consumption of the embodiments is lower. When a first sample memory macro is formed according to embodiments, with the sample memory macro comprising 1 mega memory cells and the corresponding asymmetric sense amplifier 20 as shown in FIG. 1, the total chip area of the first sample memory macro is about 90 percent the total chip area required for a second sample memory macro formed using a conventional differential design, wherein the second sample memory macro includes 1 mega memory cells and corresponding sense amplifiers, reference memory columns, and reference voltage generators.

In accordance with embodiments, a circuit includes a first inverter including a first PMOS transistor and a first NMOS transistor, and a second inverter including a second PMOS transistor and a second NMOS transistor. A first node is connected to gates of the first PMOS transistor and the first NMOS transistor and drains of the second PMOS transistor and the second NMOS transistor. A second node is connected to gates of the second PMOS transistor and the second NMOS transistor and drains of the first PMOS transistor and the first NMOS transistor. The circuit further includes a first capacitor having a first capacitance connected to the first node; and a second capacitor having a second capacitance connected to the second node. The second capacitance is greater than the first capacitance.

In accordance with other embodiments, a circuit includes a memory array; a data line configured to receive a signal from a bit line of the memory array; a data latch; and a first node and a second node, wherein the first and the second nodes are complementary nodes of the data latch. A first capacitor having a first capacitance is connected to the first node. A second capacitor having a second capacitance is connected to the second node, wherein the second capacitance is greater than the first capacitance. The circuit further includes a voltage source configured to supply a fixed voltage to an output of the voltage source. A first data-in transistor has a first source/drain region connected to the output of the voltage source, and a second source/drain region connected to the first node. A second data-in transistor has a first source/drain region connected to the data line, and a second source/drain region connected to the second node.

In accordance with yet other embodiments, a method for reading from a memory includes pre-charging a first node and a second node of a sense amplifier to a same voltage. The first node is coupled to a power supply node through a first capacitor, and the second node is coupled to the power supply node through a second capacitor, wherein the first capacitor has a first capacitance smaller than a second capacitance of the second capacitor. The method further includes receiving a voltage from a bit line of the memory into a data line; and after the step of receiving the voltage, turning on a first transistor to receive a fixed voltage into the sense amplifier, wherein the fixed voltage is connected to the first node in the sense amplifier. At a time the step of turning on the first transistor is performed, a second transistor is simultaneously turned on to receive the voltage to the second node of the sense amplifier.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method for reading from a memory, the method comprising:
    pre-charging a first node and a second node of a sense amplifier to a same voltage, wherein the first node is coupled to a power supply node through a first capacitor, and the second node is coupled to the power supply node through a second capacitor, and wherein the first capacitor has a first capacitance smaller than a second capacitance of the second capacitor;
    receiving a data voltage from a bit line of the memory into a data line;
    after the step of receiving the data voltage, receiving a fixed voltage into the sense amplifier, wherein the fixed voltage is connected to the first node in the sense amplifier; and
    at a time the fixed voltage is received, simultaneously receiving the data voltage on the data line into the sense amplifier, wherein the voltage is received to the second node.

2. The method of claim 1, wherein the fixed voltage is a logic high voltage substantially equal to the same voltage, and wherein the method further comprises, after the fixed voltage and the data voltage are received, discharging the first and the second nodes until the sense amplifier enters into a stable state.

3. The method of claim 2 further comprising determining whether the data voltage received from the bit line is a logic high voltage or a logic low voltage based on the stable state.

4. The method of claim 1, wherein the fixed voltage is a logic low voltage substantially equal to the same voltage, and wherein the method further comprises, after the fixed voltage and the data voltage are received, charging the first and the second nodes until the sense amplifier enters into a stable state.

5. The method of claim 4 further comprising determining whether the data voltage received from the bit line is a logic high voltage or a logic low voltage based on the stable state.

6. The method of claim 1, wherein a ratio of the second capacitance to the first capacitance is greater than about 1.2.

7. The method of claim 6, wherein the ratio of the second capacitance to the first capacitance is greater than about 1.5.

8. The method of claim 1, wherein the first and the second capacitors comprise Metal Oxide Semiconductor (MOS) transistors, with source regions of the MOS transistors connected to drain regions of the respective MOS transistors.

9. A method for reading from a memory, the method comprising:
    pre-charging a first capacitor and a second capacitor of a sense amplifier, wherein the first capacitor has a first capacitance smaller than a second capacitance of the second capacitor;
    receiving a datum from a bit line of the memory into a data line;
    after the step of receiving the datum, applying a fixed voltage on the sense amplifier, wherein the fixed voltage is connected to a first capacitor plate of the first capacitor;
    at a time the fixed voltage is applied on to the first capacitor plate, simultaneously connecting the datum to a second capacitor plate of the second capacitor;
    simultaneously connecting the first capacitor plate and the second capacitor plate to a power supply voltage until a stable state is reached; and
    determining the datum based on the stable state.

10. The method of claim 9, wherein the fixed voltage is a logic high voltage, and wherein the first capacitor plate and the second capacitor plate are connected to a power supply voltage VSS voltage during the step of simultaneously connecting.

11. The method of claim 10, wherein in the step of pre-charging, the first capacitor and the second capacitor are pre-charged to a positive power supply voltage VDD, and wherein the fixed voltage is lower than positive power supply voltage VDD.

12. The method of claim 11, wherein the fixed voltage is higher than about 80 percent positive power supply voltage VDD.

13. The method of claim 9, wherein the fixed voltage is a logic low voltage, and wherein the first capacitor plate and the second capacitor plate are connected to a positive power supply voltage VDD during the step of simultaneously connecting.

14. The method of claim 13, wherein the fixed voltage is substantially equal to a power supply voltage VSS.

15. The method of claim 9, wherein a ratio of the second capacitance to the first capacitance is greater than about 1.2.

16. The method of claim 15, wherein the ratio of the second capacitance to the first capacitance is greater than about 1.5.

17. The method of claim 9, wherein the first and the second capacitors comprise Metal Oxide Semiconductor (MOS) transistors, with source regions of the MOS transistors connected to drain regions of the respective MOS transistors.

* * * * *